(12) United States Patent
Liang et al.

(10) Patent No.: US 11,355,361 B1
(45) Date of Patent: Jun. 7, 2022

(54) METHOD OF MEASURING UNDERFILL PROFILE OF UNDERFILL CAVITY HAVING SOLDER BUMPS

(71) Applicant: CORETECH SYSTEM CO., LTD., Zhubei (TW)

(72) Inventors: Yu-En Liang, Zhubei (TW); Chia-Peng Sun, Zhubei (TW); Chih-Chung Hsu, Zhubei (TW); Rong-Yeu Chang, Zhubei (TW); Chia-Hsiang Hsu, Zhubei (TW)

(73) Assignee: CORETECH SYSTEM CO., LTD., Zhubei (TW)

( * ) Notice: Subject to any disclaimer, the term of this patent is extended or adjusted under 35 U.S.C. 154(b) by 0 days.

(21) Appl. No.: 17/381,515

(22) Filed: Jul. 21, 2021

Related U.S. Application Data

(60) Provisional application No. 63/180,859, filed on Apr. 28, 2021.

(51) Int. Cl.
  *H01L 21/56* (2006.01)
  *H01L 23/00* (2006.01)
  *H01L 21/66* (2006.01)

(52) U.S. Cl.
  CPC ............ *H01L 21/563* (2013.01); *H01L 22/20* (2013.01); *H01L 24/11* (2013.01); *H01L 24/27* (2013.01); *H01L 24/73* (2013.01); *H01L 2224/117* (2013.01); *H01L 2224/119* (2013.01); *H01L 2224/277* (2013.01); *H01L 2224/279* (2013.01); *H01L 2224/73204* (2013.01)

(58) Field of Classification Search
  CPC ........... H01L 24/73; H01L 2224/73204; H01L 22/20; H01L 24/11; H01L 21/563; H01L 24/27
  See application file for complete search history.

(56) References Cited

U.S. PATENT DOCUMENTS

| 2014/0030827 A1* | 1/2014 | Cadotte | ................. H01L 21/563 438/14 |
| 2018/0079939 A1* | 3/2018 | Kubota | ................... H01L 24/92 |

OTHER PUBLICATIONS

Yao et al. "International Oil and Gas Conference and Exhibition" in China, Being. Paper No. SPE-130287-MS. Published: Jun. 8, 2010.*
(Continued)

*Primary Examiner* — Jasmine J Clark
(74) *Attorney, Agent, or Firm* — Muncy, Geissler, Olds & Lowe, P.C.

(57) ABSTRACT

The present disclosure provides a method for measuring an underfill profile of an underfill material in an underfill cavity having a plurality of solder bumps. The method includes the operations of: determining a mesh having a plurality of elements according to the underfill cavity; calculating a reference force according to the underfill cavity; obtaining a driving force and a flow speed of the underfill material according to a plurality of weighting factors and the reference force, wherein the plurality of weighting factors respectively correspond to the plurality of elements; obtaining a plurality of volume fractions respectively corresponding to the plurality of elements according to the flow speed; and obtaining the underfill profile according to the plurality of volume fractions.

19 Claims, 12 Drawing Sheets

(56) References Cited

OTHER PUBLICATIONS

Ca et al. "Lucas-Washburn Equation-Based Modeling of Capillary-Driven Flow in Porous Systems", : Langmuir 2021, 37, 1623-1636.*
Lattice Boltzmann Method of Different BGA Orientations on I-Type Dispensing Method, pp. 1-26, Aizat Abas et al. (Year: 2016).*
Prediction of filling time in capillary-driven underfill process through 3D numerical analysis, pp. 1-5, Kanglun et al. (Year: 2018).*
Tao et al., "A New Analysis of the Capillary Driving Pressure for Underfill Flow in Flip-Chip Packaging," IEEE Transactions On Components, Packaing and Manufacturing Technology, vol. 4, No. 9, Sep. 2014, pp. 1534-1544, 11 pages.
Zheng et al., "An Examination of Underfill Flow in Large Dies With Nonumiform Bump Patterns," IEEE Transactions On Components and Packaing Technoogies, vol. 33, No. 1, Mar. 2010, pp. 196-205, 10 pages.

* cited by examiner

US 11,355,361 B1

METHOD OF MEASURING UNDERFILL PROFILE OF UNDERFILL CAVITY HAVING SOLDER BUMPS

CROSS-REFERENCE TO RELATED APPLICATIONS

This application claims the benefit of prior-filed provisional application with application No. 63/180,859, filed Apr. 28, 2021, which is incorporated by reference in its entirety.

TECHNICAL FIELD

The present disclosure relates to a measurement method, and more particularly, to a method of measuring an underfill process.

DISCUSSION OF THE BACKGROUND

Flip chip bonding was developed around 1960. The technology is able to reduce the footprint of the IC chip and the packaging substrate, thereby reducing the cost of the material thereof. In the bonding process, the solder bumps are heated to bond with the IC chip, then an underfill process is performed to encapsulate the space between the IC chip and the substrate. Moreover, the solder bumps are also encapsulated by the underfill material. The coverage of the underfill material of the solder bumps is critical to the electrical quality of the solder bumps, such as the conductivity of the solder bumps Therefore, the performance of the underfilling has become an important issue in this field.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a method of measuring an underfill profile of an underfill material in an underfill cavity having a plurality of solder bumps. The method includes the operations of: determining a mesh having a plurality of elements according to the underfill cavity; obtaining a reference force according to the underfill cavity; obtaining a driving force and a flow speed of the underfill material according to a plurality of weighting factors and the reference force, wherein the plurality of weighting factors respectively correspond to the plurality of elements; obtaining a plurality of volume fractions respectively corresponding to the plurality of elements according to the flow speed; and measuring the underfill profile according to the plurality of volume fractions.

In some embodiments, the method further includes dispensing the underfill material into the underfill cavity to encapsulate the underfill cavity when the underfill profile matches with a predetermined profile.

In some embodiments, the method further includes modifying at least one of the plurality of the weighting factors when the underfill profile is deviated from the predetermined profile.

In some embodiments, the operation of obtaining the reference force according to the underfill cavity includes the operations of: obtaining a substrate contact angle between the underfill material and a substrate of the underfill cavity; obtaining a chip contact angle between the underfill material and a chip of the underfill cavity; obtaining a distance between the substrate and the chip; obtaining a surface tension of the underfill material; and obtaining the reference force according to the substrate contact angle, the chip contact angle, the distance, and the surface tension.

In some embodiments, the reference force is independent from the plurality of solder bumps.

In some embodiments, the operation of obtaining the driving force and the flow speed of the underfill material according to the plurality of weighting factors and the reference force includes determining the plurality of weighting factors according to a plurality of bump densities of the plurality of elements.

In some embodiments, the plurality of weighting factors is determined based on modified Washburn model.

In some embodiments, the operation of determining the plurality of weighting factors according to the plurality of bump densities of the plurality of elements includes the operations of: determining the plurality of bump densities; obtaining a distance between a substrate of the underfill cavity and a chip of the underfill cavity; and obtaining the plurality of weighting factors according to the plurality of bump densities and the distance between the substrate of the underfill cavity and the chip of the underfill cavity.

In some embodiments, the operation of determining the plurality of bump densities includes the operations of: obtaining a diameter of the plurality of solder bumps; obtaining a distance between two of the adjacent solder bumps; and obtaining the plurality of bump densities according to the diameter and the distance between two of the adjacent solder bumps.

In some embodiments, the operation of determining the plurality of weighting factors according to the plurality of bump densities of the plurality of elements further includes obtaining a bump contact angle between the underfill material and the plurality of solder bumps. The plurality of weighting factors are obtained further according to the bump contact angle.

In some embodiments, the plurality of weighting factors is determined based on Yao's model.

In some embodiments, the operation of obtaining the driving force and the flow speed of the underfill material according to the plurality of weighting factors and the reference force includes determining a resistance factor of the plurality of solder bumps. The driving force and the flow speed are obtained further according to the resistance factor of the plurality of solder bumps.

In some embodiments, the operation of determining the plurality of weighting factors according to a plurality of bump densities of the plurality of elements includes categorizing the plurality of elements into a plurality of groups. The elements in the same group have the same weighting factor.

In some embodiments, the driving force and the flow speed are obtained based on Navier Stokes Equation.

In some embodiments, the plurality of volume fractions are obtained based on a transport equation.

In some embodiments, a number of the plurality of elements is less than a number of the plurality of solder bumps.

In some embodiments, the method further includes the operations of: obtaining a density of the underfill material, a viscosity of the underfill material, and a shear rate of the underfill material; and obtaining a pressure in the underfill cavity. The driving force and the flow speed are obtained further according to the density of the underfill material, the viscosity of the underfill material, the shear rate of the underfill material, and the pressure in the underfill cavity.

In some embodiments, the method further includes determining a welding angle according to the underfill profile.

In some embodiments, the method further includes modifying at least one of the plurality of the weighting factors when the welding angle is less than a predetermined angle.

In some embodiments, the predetermined angle is about 135 or 145 degree.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

Figure 1:
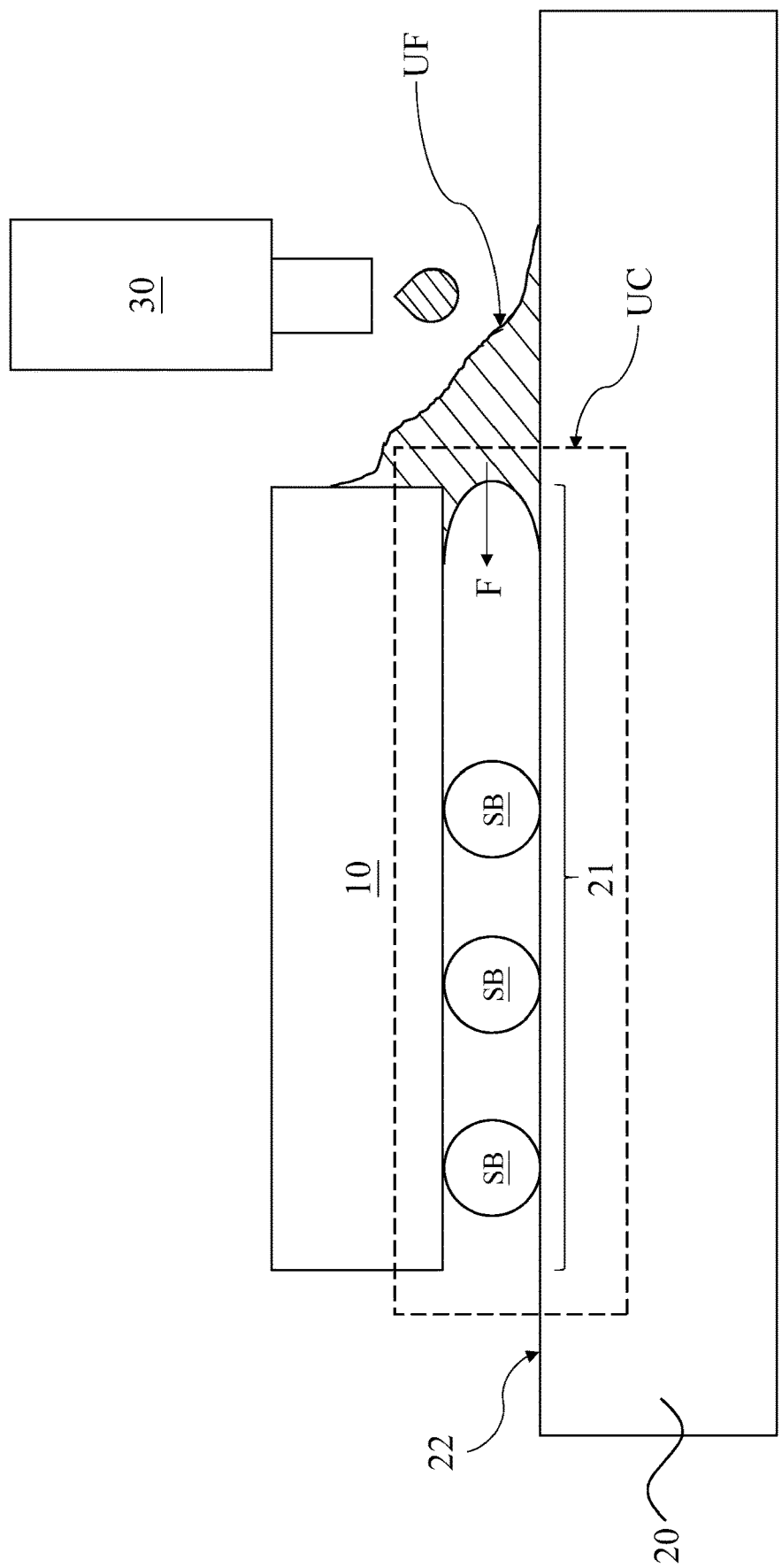
FIG. 1 is a schematic view of an underfill process according to some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic view of an underfill process according to some embodiments of the present disclosure. In the underfill process, a chip 10 is disposed on a substrate 20 within a bonding area 21. The substrate 20 includes a plurality of solder bumps SB disposed on the surface 22 of the substrate 20 within the bounding area 21, and the chip 10 is in contact with the solder bumps SB. The solder bumps SB are configured to couple the circuit on the chip 10 to the pins on the substrate 20 for functional or virtual connections. Then, a thermal process is performed to solder the chip 10 and the solder bumps SB together so as to form a shortest path from the chip 10 to the substrate 20. In some embodiments, the thermal process is a reflow soldering process.

After the thermal process, an underfill cavity UC is formed and enclosed by the chip 10 and the substrate 20 as illustrated in FIG. 1. A dispenser 30 is configured to provide an underfill material UF to fill the underfill cavity UC so as to encapsulate the solder bumps SB in the underfill cavity UC.

The underfill material UF is configured to encapsulate the solder bumps SB to protect the solder bumps SB, and further configured to support the underfill cavity UC to prevent from collapsing. In other words, the underfill material UF also provides physical support between the chip 10 and the substrate 20.

The underfill material UF is driven by a capillary force F (hereinafter, the capillary force F is also referred to as driving force F) due to the capillary action between the underfill material UF and the chip 10 and between the underfill material UF and the substrate 20. In some embodiments, the capillary force F is obtained based on Navier Stokes Equation (1).

$$\frac{\partial}{\partial t}(\rho v) + \nabla \cdot \rho v v - \nabla \cdot (\eta \dot{\gamma}) = -\nabla p + F \quad (1)$$

In equation (1), $\rho$ is the density of the underfill material UF, v is the flow speed of the underfill material UF in the underfill cavity UC, $\eta$ is the viscosity of the underfill material UF, $\dot{\gamma}$ is the shear rate of the underfill UF, and p is the pressure.

The density, the viscosity, and the shear rate of the underfill material UF are associated with the underfill material UF. In some embodiments, the above parameters of the underfill material UF and the pressure are also referred to as boundary conditions in the underfill process Before filling the underfill material UF to the underfill cavity UC, an underfill profile Puf is measured to ensure the performance of the underfill process. More particularly, the underfill profile Puf is measured by a method M2 as illustrated FIG. 2 below, and the measured underfill profile Puf is transformed to a real profile of underfilling by performing the underfill process according to the boundary conditions used in measuring the underfill profile Puf. Conventional, the complexity of the measurement is positively correlated to the number of the solder bumps S. In order to improve the efficiency of the measurement, the present disclosure provides the method M2 with less complexity to measure the underfill profile Puf no matter how many solder bumps SB disposed on the surface 22 of the substrate 20.

Conventional, the complexity of the measurement is positively correlated to the number of the solder bumps BS. In order to improve the efficiency of the measurement, the present disclosure provides the method M2 with less complexity to measure the underfill profile Puf no matter how many solder bumps SB disposed on the surface 22 of the substrate 20.

Figure 2:
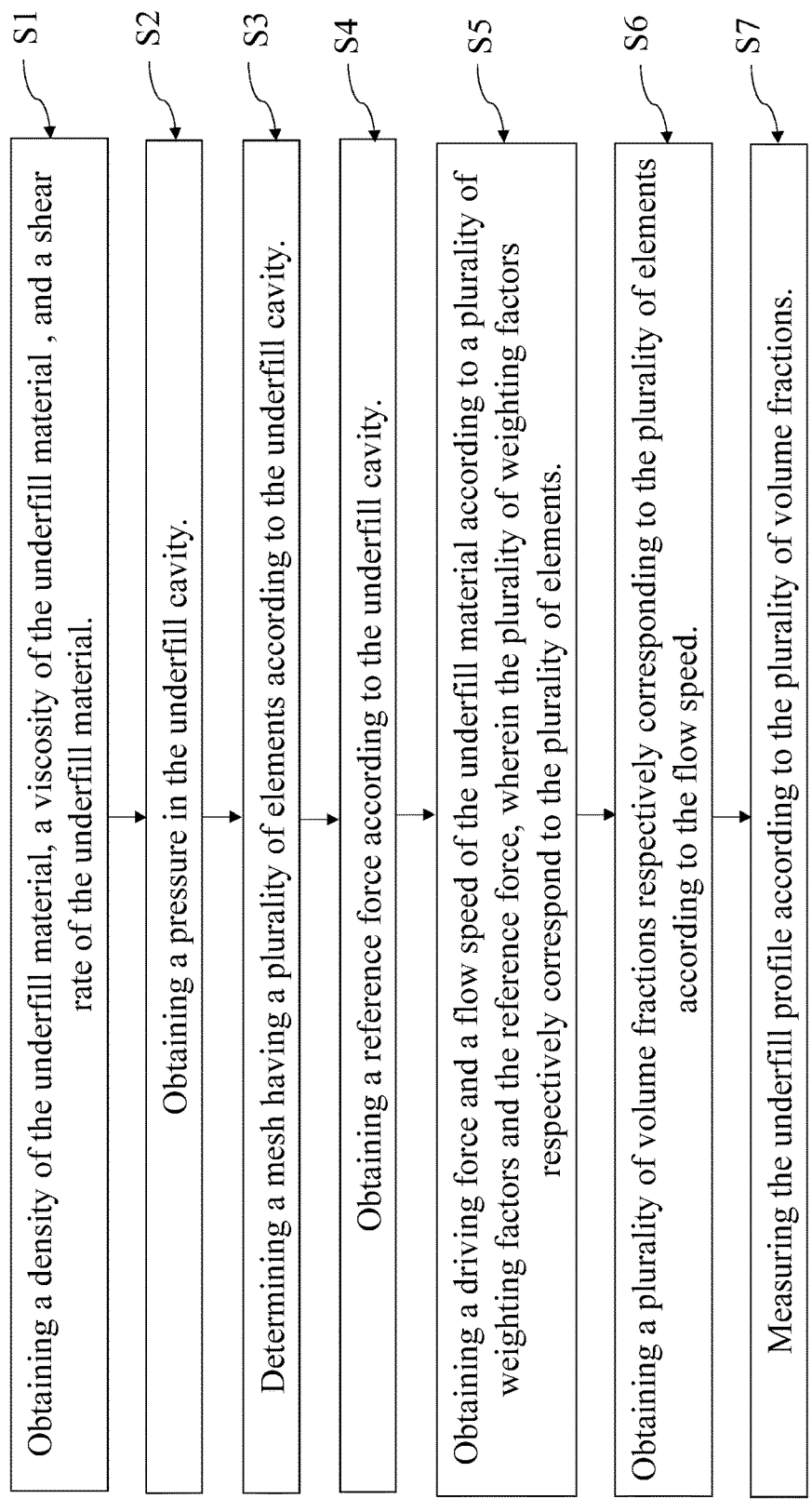
FIG. 2 is a flow chart of a method for simulating an underfill profile according to some embodiments of the present disclosure.

Reference is made to FIG. 2. FIG. 2 is a flow chart of the method M2 of measuring the underfill profile Puf according to some embodiments of the present disclosure. To facilitate understanding, the method M2 is described by using the reference numerals shown in FIG. 1.

In some embodiments, the method M2 is performed by a system including the chip 10, the substrate 20, the dispenser 30, and a processor (not shown). In some embodiments, the processor is configured to perform the method M2 by using computer-assisted engineering (CAE). After the underfill profile Puf is obtained, the processor controls the dispenser 30 to provide the underfill material UF to encapsulate the solder bumps SB according to the boundary conditions which lead to the underfill profile Puf, so as to transform the measured result of the underfill profile Puf to the chip 10, the substrate 20, the solder bumps SB, and the filled underfill material UF.

The method M2 includes operations S1, S2, S3, S4, S5, S6, and S7. In operation S1, the density $\rho$ of the underfill material UF, the viscosity $\eta$ of underfill material UF, and the shear rate $\dot{\gamma}$ of the underfill material UF are obtained. In other words, the underfill material F is determined and the parameters associated with the material can be obtained.

In operation S2, the pressure p in the underfill cavity UC is obtained. In some embodiments, the pressure p in the underfill cavity UC is substantially identical to the pressure in the processing area. Therefore, when the pressure in the processing area is changed, the pressure p in the underfill cavity UC is changed accordingly.

Figure 3:
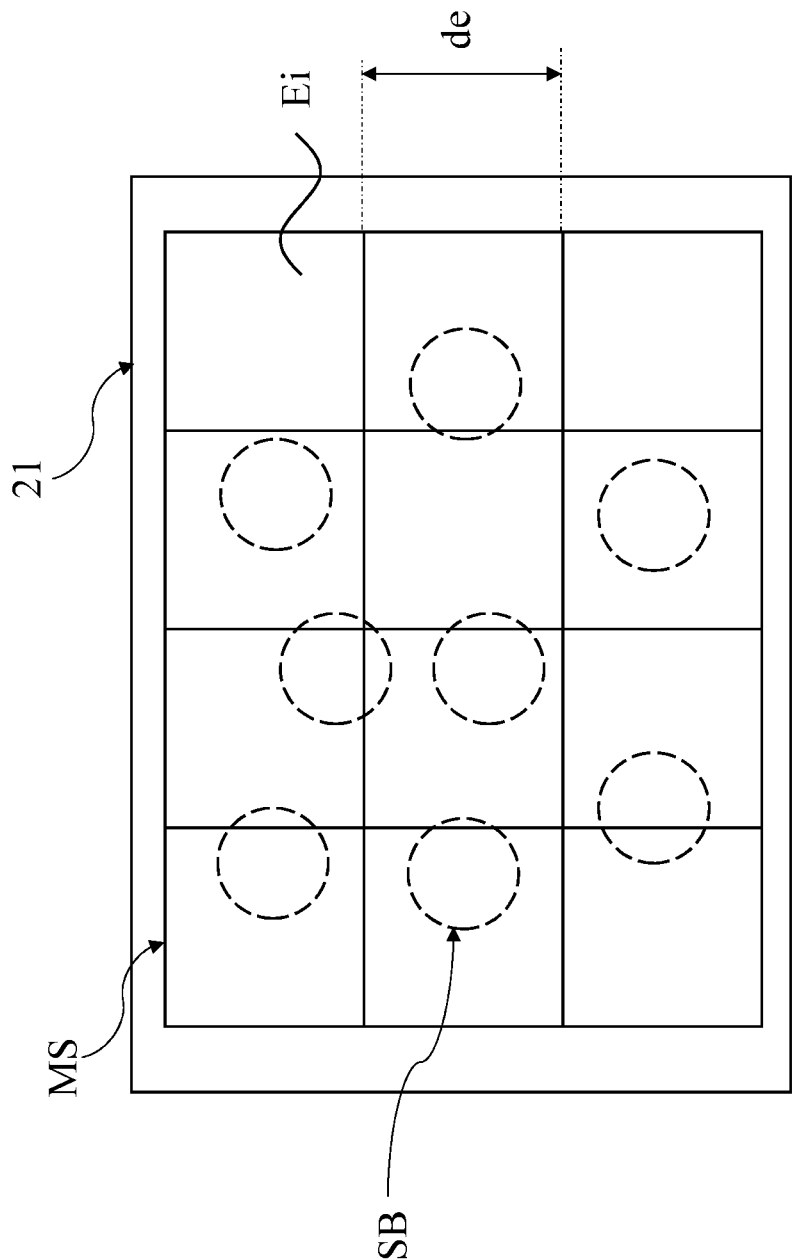
FIG. 3 is a schematic view of a mesh from a top view of a bonding area of a substrate according to some embodiments of the present disclosure.

In operation S3, a mesh MS having elements Ei is determined according to the underfill cavity UC. Please refer to FIG. 3. FIG. 3 is a schematic view of the mesh MS from a top view of the bonding area 21 according to some embodiments of the present disclosure. In some embodiments, the mesh MS has a shape substantially the same as the bonding area 21 from the top view of the bonding area 21. To facilitate understanding, the bonding area 21 and the mesh MS are not overlapped in FIG. 3. The mesh MS includes the plurality of elements Ei. In some embodiments, each elements Ei are identical, and the elements Ei are arranged independently from the solder bumps SB. In some embodiments, each element Ei is a square, and a side of the square has a length de (i.e., a dimension of the element Ei). The mesh MS is configured to define a simulation domain of the underfill profile Puf. More specifically, the underfill profile Puf in each element Ei will be estimated. Thereby, the underfill profile Puf in one element Ei represents the estimated result of underfilling in the bonding area 21 corresponding to the said element Ei. In some embodiments, the number of the elements Ei in the mesh MS is less than the number of the solder bumps Sb. In some further embodiments, the number of the elements Ei is less than a quarter of the number of the solder bumps SB.

Figure 4:
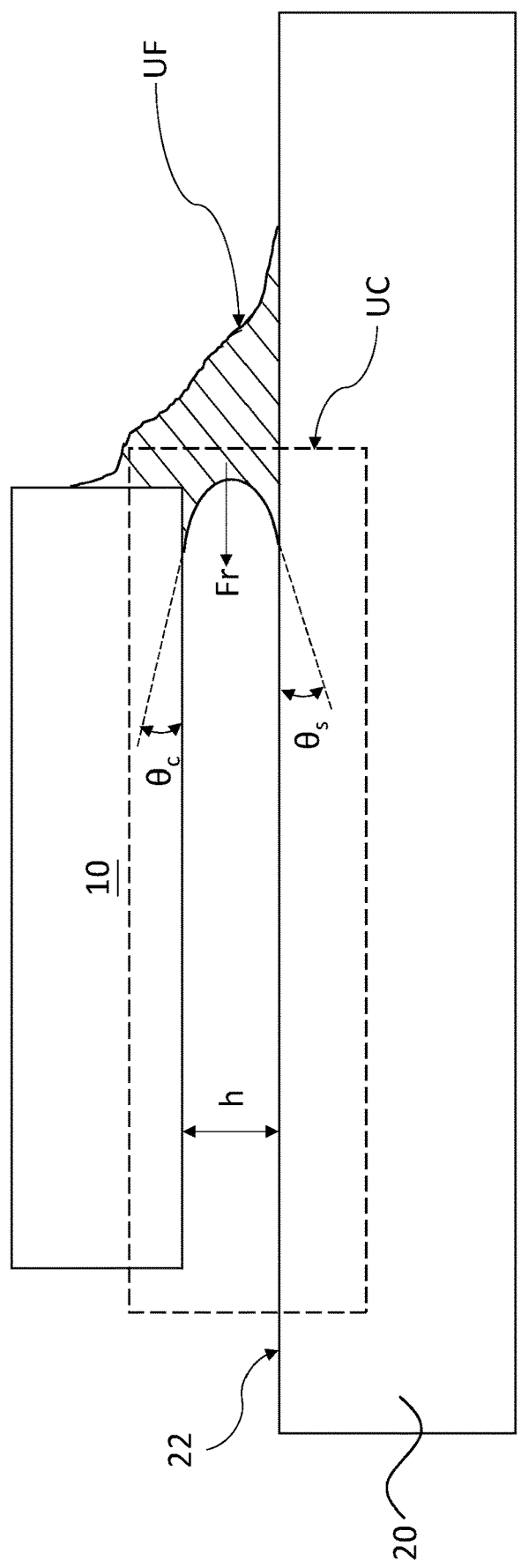
FIG. 4 is schematic view of a capillary pressure model according to some embodiments of the present disclosure.

In operation S4, a reference force Fr is obtained according to the underfill cavity. In some embodiments, the reference force Fr is obtained based on the capillary pressure model. Please refer to FIG. 4. FIG. 4 is a schematic view of a capillary pressure model according to some embodiments of the present disclosure. The reference force Fr in the underfill cavity UC is obtained by using the capillary pressure model, and the determined reference force Fr is a force which drives the underfill material UF into the underfill cavity UC deducing the effect of the solder bumps SB. Alternatively stated, the reference force Fr can be viewed as a driving force F in the underfill cavity UC without the solder bumps SB. The reference force Fr can be obtained from an equation (2).

$$Fr \propto \sigma(\cos\theta_s + \cos\theta_c)/h \quad (2)$$

In equation (2), the right side of equation is equal to a pressure difference between the underfill material UF and the space haven't been occupied by the underfill material UF in the underfill cavity UC. $\theta_c$ is a chip contact angle between the underfill material UF and the chip 10, $\theta_s$ is a substrate contact angle between the underfill material UF and the substrate 20, $\sigma$ is the surface tension of the underfill material UF, and h is the distance between the chip 10 and the substrate 20. Because the unit of the pressure is equal to force dividing area, the reference force Fr thus can be obtained when a cross-section area of the underfill cavity is known. Therefore, when the length de (shown in FIG. 3) and the distance h are known, the reference force Fr in each elements Ei can be obtained.

Figure 5:
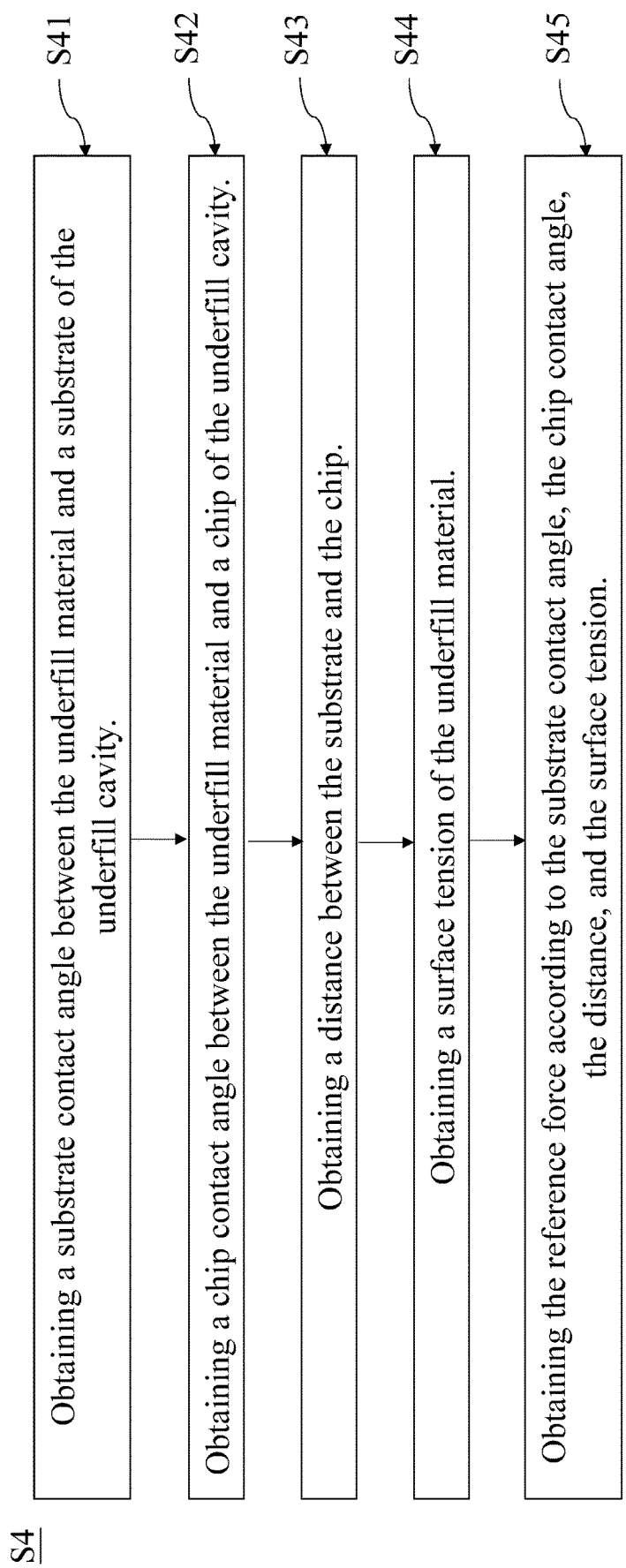
FIG. 5 is a flow chart of an operation of the method shown in FIG. 2 according to some embodiments of the present disclosure.

Please refer to FIG. 5. FIG. 5 is a flow chart of the operation S4 according to some embodiments of the present disclosure. In some embodiments, the operations S4 includes operations S41, S42, S43, S44, and S45. In operation S41, the substrate contact angle $\theta_s$ is obtained. In operation S42, the chip contact angle $\theta_c$ is obtained. In operation S43, the distance h is obtained. In operation S44, the surface tension $\sigma$ of the underfill material UF is obtained.

In operation S45, the reference force Fr is obtained according to the substrate contact angle $\theta_s$, the chip contact angle $\theta_c$, the distance h, and the surface tension $\sigma$.

Please refer to FIG. 2 again. In operation S5, the driving force F and the flow speed v are obtained according to a plurality of weighting factors Wi and the reference force Fr. As mentioned before, the reference force Fr represents the force without the effect of solder bumps SB. In order to obtain the force with the effect of solder bumps SB, the weighting factors Wi are generated and configured to represent the effect of solder bumps SB. More specifically, the weighting factors Wi correspond to the elements Ei, respectively. The driving force F in the elements Ei is equal to the weighting factors Wi multiplying the reference force Fr, respectively. After the driving force F is obtained, the flow speed v can be obtained based on the modified Navier Stokes Equation as shown in an equation (3).

$$\frac{\partial}{\partial t}(\rho v) + \nabla \cdot \rho v v - \nabla \cdot (\eta \dot{\gamma}) = -\nabla p + Wi \times Fr \quad (3)$$

Compared to Navier Stokes Equation (1), the driving force F is replaced by the weighting factors Wi multiplying the reference force Fr in the modified Navier Stokes Equation (3).

In some embodiments, the weighting factors Wi are obtained based on modified Washburn model. In other embodiments, the weighting factors Wi are obtained based on Yao's model. In various embodiments, the weighting factors Wi are obtained by other suitable approaches. The details of obtaining the weighting factors Wi will be described below with respect to FIG. 6 to FIG. 10.

In operation S6, a plurality of volume fractions (VOF) $\varphi$ are obtained according to the flow speed v, wherein the plurality of volume fractions $\varphi$ respectively correspond to the plurality of elements Ei. Each volume fraction $\varphi$ is a function of time t and represents a ratio of the volume occupied by the underfill material UF to the total volume of one element Ei. According to the volume fractions $\varphi$, the flowing behavior of the underfill material UF in the elements Ei is obtained. In some embodiments, the plurality of volume fractions (e are obtained based on a transport equation (4).

$$\frac{\partial \varphi}{\partial t} + v \nabla \varphi = 0 \quad (4)$$

Please refer to FIG. 2 again. In operation S7, the underfill profile Puf is obtained according to the plurality of volume fractions $\varphi$. The underfill profile Puf represents the flowing behavior of the underfill material UF in the measurement domain (i.e., in the mesh MS). Because the plurality of volume fractions $\varphi$ represent the flowing behavior of the underfill material UF in the plurality of elements Ei, the underfill profile Puf can be obtained by arranging all of the plurality of volume fractions $\varphi$ corresponding to the positions of the plurality of elements Ei.

Figure 6:
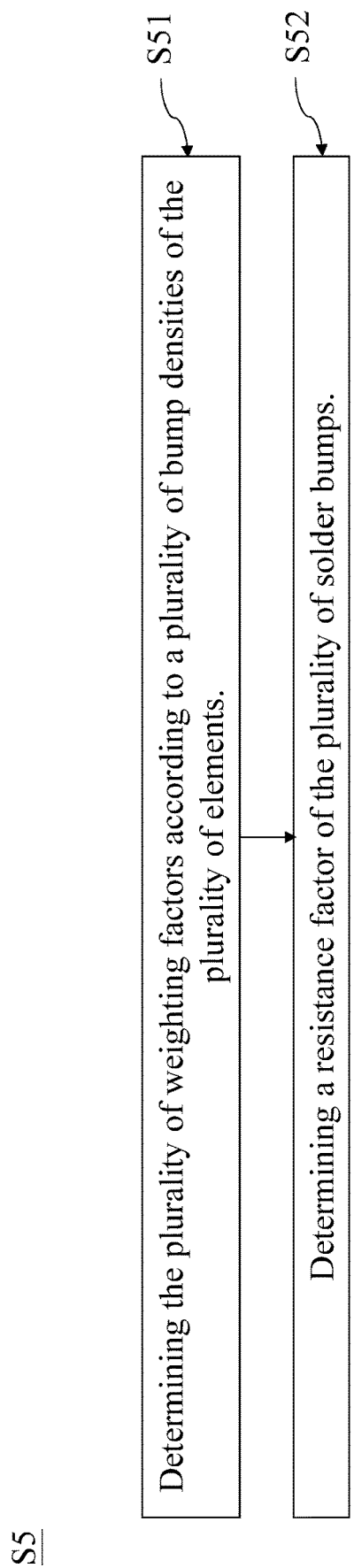
FIG. 6 is a flow chart of an operation of the method shown in FIG. 2 according to some embodiments of the present disclosure.

Reference is made to FIG. 6. FIG. 6 is a flow chart of the operation S5 of the method M2 according to some embodiments of the present disclosure. In some embodiments, the operation S5 includes operations S51 and S52.

Figure 7:
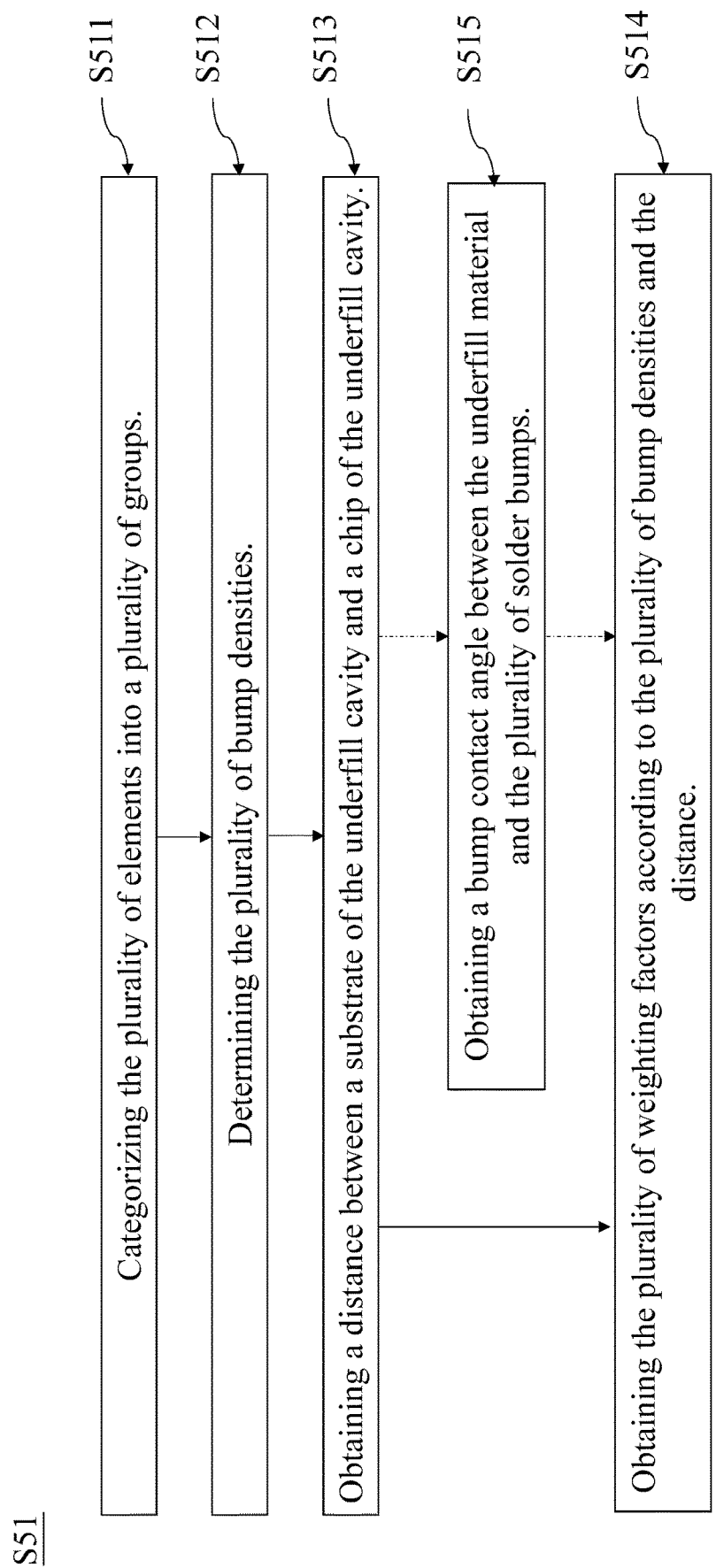
FIG. 7 is a flow chart of an operation of the method shown in FIG. 6 according to some embodiments of the present disclosure.
Figure 8:
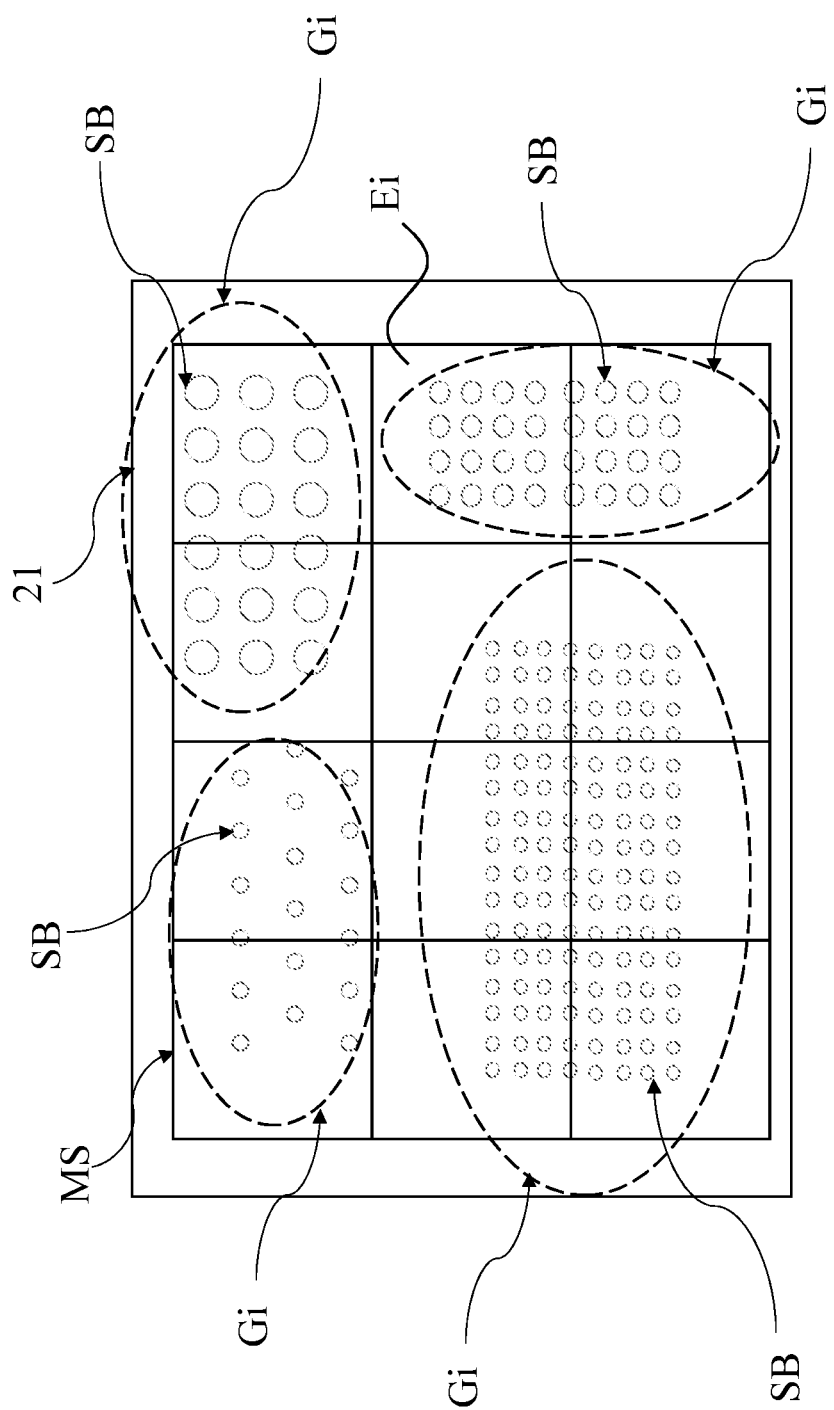
FIG. 8 is a schematic view of the mesh as shown in FIG. 3 according to other embodiments of the present disclosure.
Figure 9:
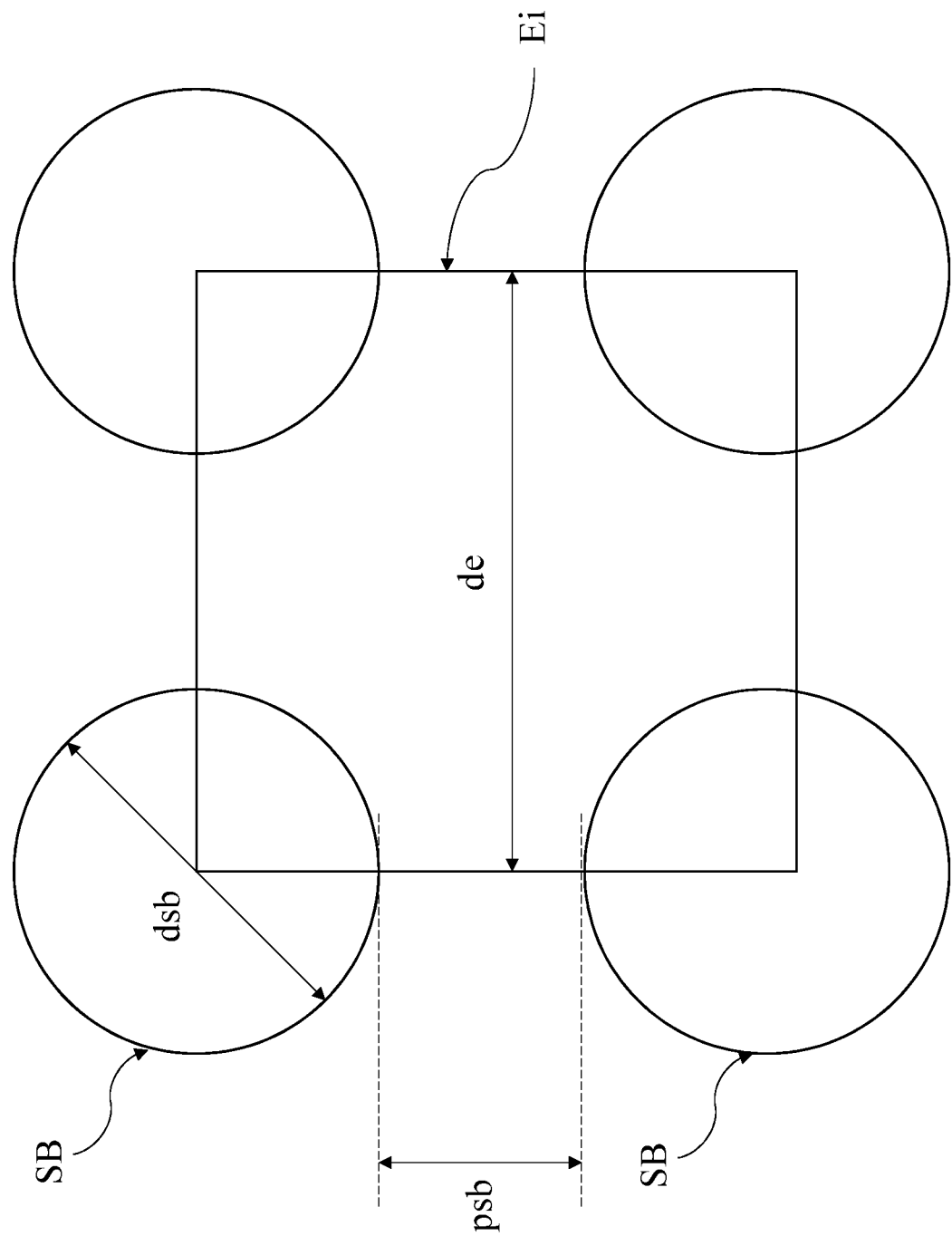
FIG. 9 is a schematic view of an element of the mesh as shown in FIG. 3 according to some embodiments of the present disclosure.
Figure 10:
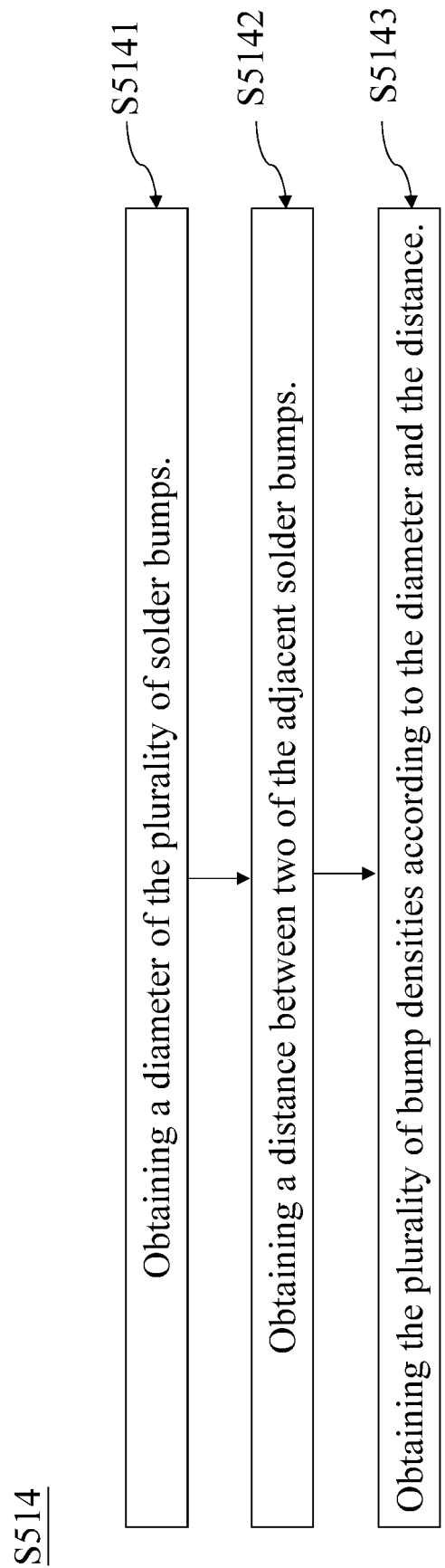
FIG. 10 is a flow chart of an operation of the method as shown in FIG. 7 according to some embodiments of the present disclosure.

In operation S51, the weighting factors Wi are determined according to a plurality of bump densities $\beta$ of the plurality of elements Ei. The bump density $\beta$ represents a ratio of a volume occupied by the solder bumps SB in the element Ei to the total volume of the element Ei. In some embodiments, the solder bumps SB are assumed as cylinders. In this embodiment, the bump density $\beta$ effectively represents a ratio of an area occupied by the solder bumps Sb to the area of the element Ei from a top view of the element Ei. Please also refer to FIG. 7, FIG. 8, FIG. 9, and FIG. 10. FIG. 7 and FIG. 10 are flow charts of the operation S51 according some embodiments of the present disclosure. FIG. 8 is a schematic view of the mesh MS according to other embodiments of the present disclosure. FIG. 9 is a schematic view of the element Ei according to the operation S51 in some embodiments of the present disclosure.

As illustrated in FIG. 7, the operation S51 includes operations S511, S512, S513, and S514.

In operation S511, the plurality of elements Ei are categorized into a plurality of groups Gi. In some embodiments, the plurality of solder bumps SB have different size and different distribution. Please refer to FIG. 8, the elements are categorized into several groups Gi according to the distribution of the solder bumps SB. More specifically, the distribution of the solder bumps SB is similarly in the same group Gi, and the distribution of the solder bumps SB are different in different groups Gi. In some embodiments, the operation S511 is omitted.

In operation S512, the plurality of bump densities $\beta$ are determined. In some embodiments, the plurality of bump densities $\beta$ of the plurality of elements Ei are determined according to the illustration in FIG. 9. In FIG. 9, the solder bumps SB are assumed as cylinders, and the solder bumps SB are assumed to arrange at four corners of the element Ei. The bump density $\beta$ of the element Ei is thus obtained by an equation (5).

$$\beta = \frac{\pi dsb^2 / 4}{(dsb + psb)^2} \quad (5)$$

In equation (5), dsb is the diameter of the solder bump SB from the top view, and psb is a distance between two adjacent solder bumps SB from the top view. In some embodiments, when the operation S511 is performed, the bump densities $\beta$ of the elements Ei in the same group Gi are determined as the same.

In operation S513, the distance h is obtained. In some embodiments, the distance h is obtained in other operations (such as the operation S43 as illustrated in FIG. 5). In operation S514, the plurality of weighting factors Wi are obtained according to the plurality of bump densities $\beta$ and the distance h.

As mentioned above, in some embodiments, the plurality of weighting factors Wi are determined based on modified Washburn model. The plurality of weighting factors Wi are related to the plurality of bump densities $\beta$ of the elements Ei. More specifically, the plurality of weighting factors Wi are obtained according to the plurality of bump densities $\beta$ based on modified Washburn model, in which the plurality of bump densities $\beta$ are determined according to the assumption illustrated in FIG. 9. In some embodiments, modified Washburn model is represented by an equation (6).

$$Wi = \frac{(1-a)(dsb + psb) + (1-2a)h}{(1-a)(dsb + psb)} \quad (6)$$

$$a = \frac{dsb}{dsb + psb} = \sqrt{\frac{4\beta}{\pi}} \quad (7)$$

The equation (7) can be derived from the equation (5). In some embodiments, the diameter dsb adding the distance psb between two adjacent solder bumps SB is equal to the length de of the element Ei. Therefore, the equations (6) and (7) can be rewritten as equations (8) and (9), respectively.

$$Wi = \frac{(1-a)de + (1-2a)h}{(1-a)de} \quad (8)$$

$$a = \frac{dsb}{de} = \sqrt{\frac{4\beta}{\pi}} \quad (9)$$

In this embodiments, the distance psb should be greater than 0. Therefore, the bump density β has a maximum value equal to π/4 when the length de is equal to the diameter dsb.

According to the equations (6) and (8), when the diameter dsb and the distance psb of the solder bumps SB are known, the plurality of weighting factors Wi can be obtained according to the equation (6). In contrast, when the bump densities β of the elements Ei are known, the plurality of weighting factors Wi can be obtained according to the equation (8).

In some embodiments, the plurality of weighting factors Wi are determined further according to a bump contact angle $\theta_b$ between the underfill material UF and the solder bumps SB. More specifically, beside the plurality of bump densities β of the plurality of elements Ei, the determining of the plurality of weighting factors Wi further takes the interaction between the underfill material UF and the solder bumps SB into consideration. Therefore, the operation S51 further includes an operation S515. In operation S515, the bump contact angle $\theta_b$ is obtained. In some embodiments, the bump contact angle $\theta_b$ relates to the material of the solder bumps SB and the underfill material UF. When the operation S515 is performed, the determining of the plurality of weighting factors Wi in the operation S514 is further according to the bump contact angle $\theta_b$. In some embodiments, when the operation S515 is performed, the weighting factors Wi are determined based on Yao's model as shown in an equation (10). Yao's model is described in detail in "A New Analysis of the Capillary Driving Pressure for Underfill Flow in Flip-Chip Packaging" published at IEEE TRANSACTIONS ON COMPONENTS, PACKAGING AND MANUFACTURING TECHNOLOGY, Vol. 4, No. 9, September 2014, which is incorporated herein by reference in its entirety.

$$Wi = \frac{h}{\sigma(\cos\theta_s + \cos\theta_c)} \cdot \frac{de^2(4-\pi a^2)\sigma/4}{\frac{h}{\cos\theta_s + \cos\theta_c} \cdot (1-a-\delta)de^2 + A} \quad (10)$$

$$A = \int_\kappa^{\pi/2} \left(\frac{\cos\theta_s + \cos\theta_c}{h} + \frac{2\cos(\cos\theta_b + \phi)}{de(1-a\cos\phi)}\right)^{-1} \cdot \frac{dS(\phi)}{d\phi} \cdot d\phi \quad (11)$$

$$\delta = \frac{2\theta_b - \sin 2\theta_b}{8(\sin 2\theta_b)^2} \quad (12)$$

$$S(\phi) = \frac{de^2}{8}\left\{4a - \pi a^2 + 2a[(2-a\cos\phi)\sin\phi - \phi a] + \left[\frac{1-a\cos\phi}{\cos(\phi+\theta b)}\right]^2 \cdot [2(\phi+\theta_b) - \pi + \sin 2(\phi+\theta_b)]\right\} \quad (13)$$

In equations (10) to (13), a is angle for contact line jump, and φ is position angle around the solder bumps SB. The angle for contact line jump a has a limitation as shown in an equation (14).

$$4a - \pi \cdot a^2 + 2a[2 - a \cdot \cos\kappa] \cdot \sin\kappa - \kappa \cdot a] + \left[\frac{1 - a \cdot \cos\kappa}{\cos(\kappa + \theta_b)}\right]^2 \cdot [2(\kappa + \theta_b) - \pi + \sin 2(\kappa + \theta_b)] = 0 \quad (14)$$

According to FIG. 9, the operation S514 includes operations S5141, S5142, and S5143 as shown in FIG. 10. In operation S5141, the diameter dsb of the solder bump SB is obtained. In operation S5142, the distance psb between two adjacent solder bumps SB is obtained. In operation S5143, the plurality of bump densities β are obtained according to the diameter dsb and the distance psb.

Reference is made to FIG. 6 again. In some embodiments, a resistance caused by the solder bumps SB to the underfill material UF is taken into consideration. In operation S52, the resistance factor Ri of the plurality of solder bumps SB is determined. And the Navier Stokes Equation is further modified as an equation (15).

$$\frac{\partial}{\partial t}(\rho v) + \nabla \cdot \rho vv - \nabla \cdot (\eta \dot{\gamma}) = -\nabla p + Wi \times (1-\beta^n) \times Fr \quad (15)$$

$$Ri = 1 - \beta^n \quad (16)$$

$$F = Wi \times (1-\beta^n) \times Fr \quad (17)$$

According to equations (15) and (16), $(1-\beta_n)$ represents the resistance factor Ri. Because the plurality of bump densities β are always less than unity (less than 1), when the bump densities β are increased, the impedance caused by the solder bumps SB is increased. The resistance factor Ri is decrease. Under this situation, the driving force F is decreased. In contrast, when the bump densities β are decreased, the impedance caused by the solder bumps SB is decreased. The resistance factor Ri is increased. Under this situation, the driving force F is increased. In some embodiments, n is equal to 0.5 or 1. In various embodiments, (1−β) also represents the porosity of the elements Ei. In this embodiments, when the porosity of the elements Ei is taken into consideration, the measurement further considers (1−β) in each element Ei.

In some embodiments, the operation S52 is omitted. Alternatively stated, the resistance factor Ri of the solder bumps SB is not been taken into consideration when obtaining the driving force F.

Figure 11:
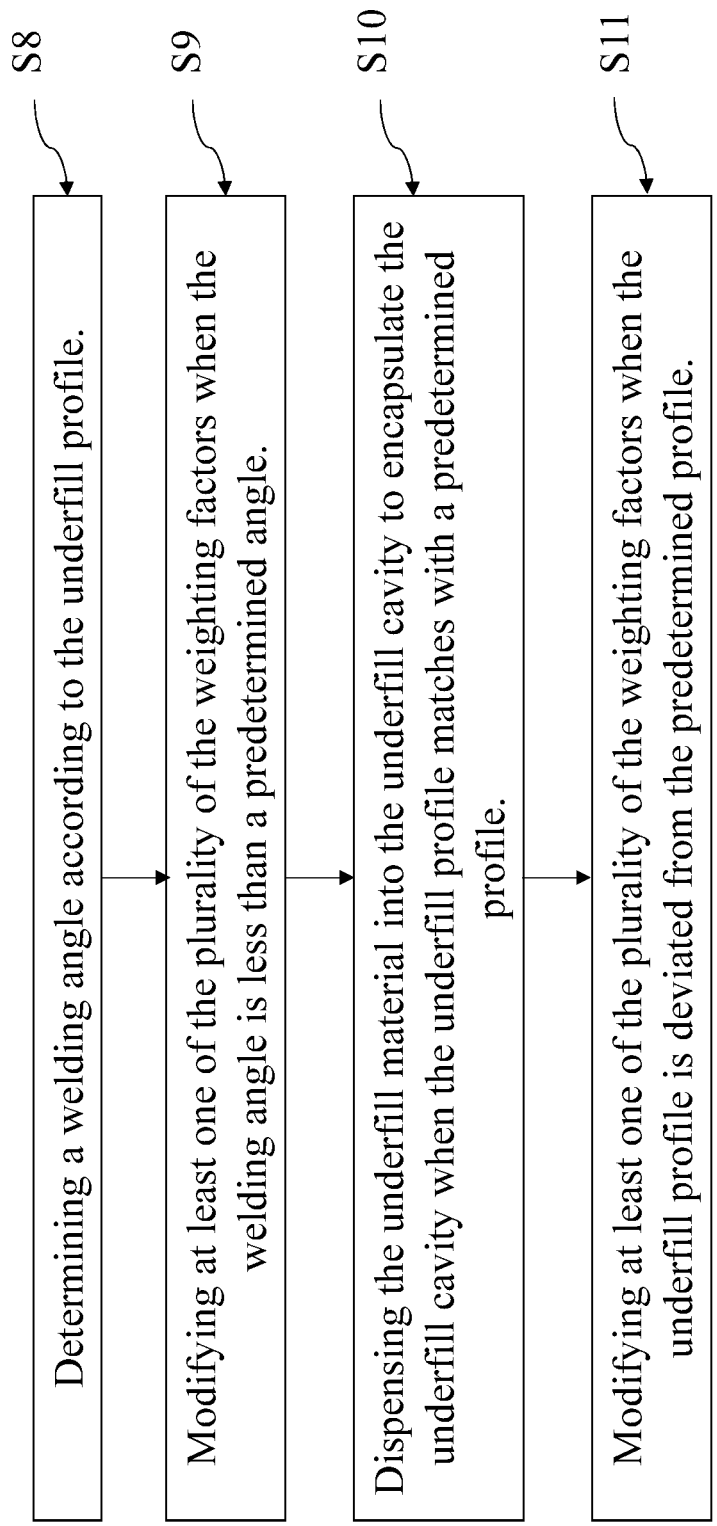
FIG. 11 is a flow char of the method as shown in FIG. 2 according to some further embodiments of the present disclosure.

Reference is made to FIG. 2 again. After the underfill profile Puf is measured and obtained, a measured result can be reviewed to determine whether the underfill process satisfies the requirements. When the result is satisfied with the requirements, the underfill material UF will be injected into the underfill cavity UC by using the boundary conditions which are used to obtain the underfill profile Puf in the method M2. In some further embodiments, the method M2 further includes operation S8, S9, S10, and S11 as shown in FIG. 11. FIG. 11 is a flow chart of the method M2 according to some further embodiments of the present disclosure.

Figure 12:
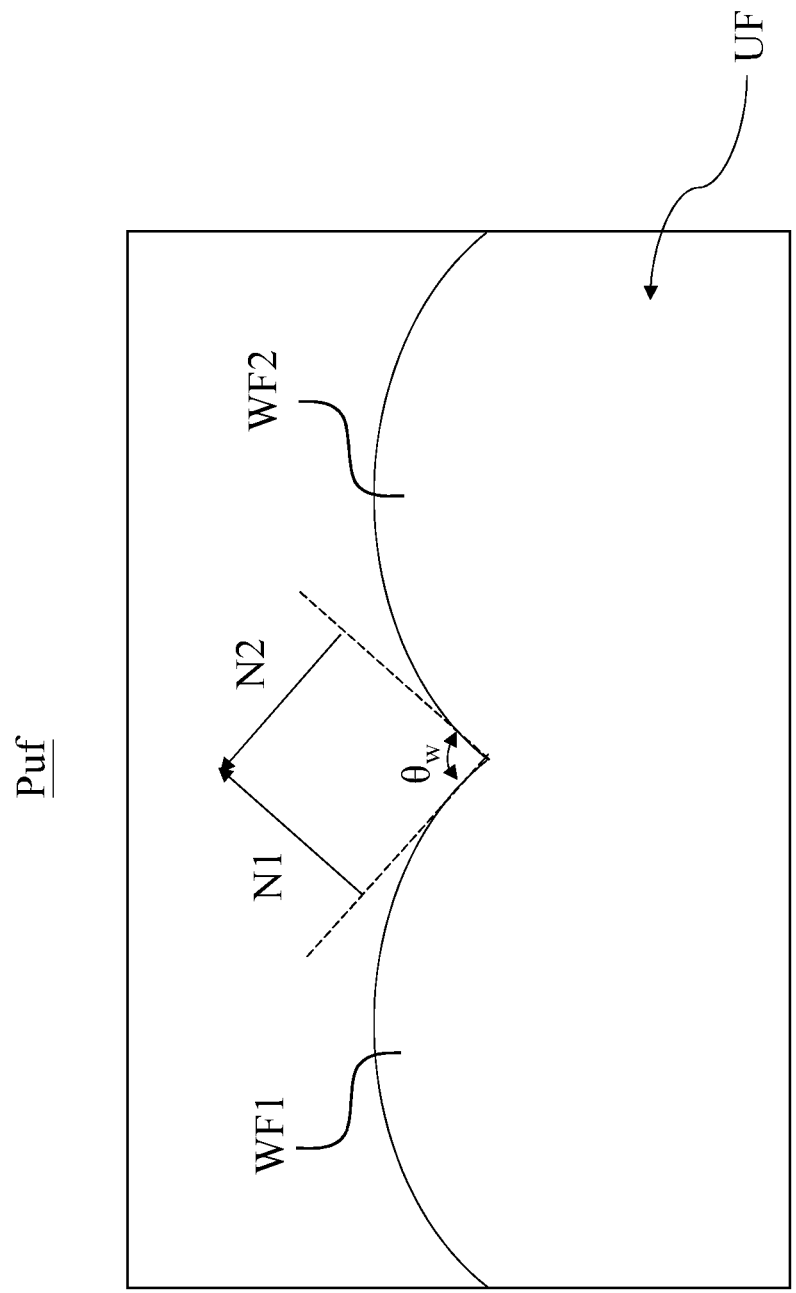
FIG. 12 is a schematic view of an underfill profile according to some embodiments of the present disclosure.

In operation S8, a welding angle $\theta_w$ is determined according to the under profile Puf. Please also refer to FIG. 12. FIG. 12 is a schematic view of the welding angle θw in the underfill profile Puf according to some embodiments of the present disclosure. The welding angle θw is an angle between two adjacent wave front of the flowing underfill material UF. In FIG. 12, the normal vector N1 and the normal vector N2 represent the normal direction at the cross-section of the wave front WF1 and the wave front WF2. The welding angle $\theta_w$ can be obtained from an equation (18).

$$\theta_w = \pi - \cos^{-1}\left(\frac{N1 \cdot N2}{|N1||N2|}\right) \quad (18)$$

In some embodiments, when a position having the welding angle $\theta_w$ is less than a predetermined angle, a void may be generated at the position after filling the underfill material UF. In some embodiments, the predetermined angle is range from about 135 degree to about 145 degree.

In some embodiments, the void decreases the protection of underfill material UF. When a void is generated at a side wall of a solder bump SB, the solder bump SB will experience less protection from the underfill material UF. In order to prevent the generation of void, in the operation S9, at least one of the plurality of weighting factors Wi is modified when the welding angle $\theta_w$ is less than the predetermined angle. Modifying the weighting factors Wi including modifying the boundary conditions, bump densities β of the elements Ei, the diameter dsb, the distance psb, the distance h, the length de, or the combinations thereof.

In various embodiments, the operation S8 further considers the gradient of the bump density β. For example, the welding angle $\theta_w$ is checked where the gradient of the bump density β varies dramatically. Therefore, at least part of the elements Ei are not checked, the time cost of the operation S8 can be improved.

Besides the void, the underfill profile Puf is checked whether the result matches a predetermined profile. For example, the filling percentage in certain area in the bonding area 21 during certain period is compared to the predetermined profile. When the underfill profile Puf matches the predetermined profile, the method M2 proceeds to the operation S10. When the underfill profile Puf does not match the predetermined profile, the method M2 proceeds to the operation S11.

In operation S10, the underfill material UF is dispensed into the underfill cavity UC to encapsulate the underfill cavity UC when the underfill profile Puf matches the predetermined profile.

In operation S11, at least one of the plurality of weighting factors Wi is modified when the underfill profile Puf is deviated from the predetermined profile Puf. In some embodiments, modifying the weighting factors Wi is performed similar to the operation S9.

The present disclosure is not limited to the operation S11. In various embodiments, in operation S11, the position where the underfill material UF dispensed is modified when the underfill profile Puf is deviated from the predetermined profile Puf. In this embodiment, the flowing behavior of the underfill material UF in the underfill cavity UC changes with the dispensed position accordingly. Consequently, the welding angle $\theta_w$ changes with the flowing behavior of the underfill material UF accordingly.

In some conventional approaches, measuring the result of encapsulation is time consuming, especially when the number of solder bumps is a lot. Compared to the conventional approaches, the embodiments provided by the present disclosure is able to measure the underfill profile Puf faster no matter how many solder bumps SB are disposed in the underfill cavity UC. Because the underfill profile Puf can be obtained quickly, the process of modifying the underfill profile Puf can be performed quickly, too. Therefore, obtaining the optimized underfill profile Puf costs less time than the conventional approaches. Thereby, the efficiency from measuring the underfill profile Puf to encapsulating the chip 10 and the substrate 20 is improved.

One aspect of the present disclosure provides a method of measuring an underfill profile of an underfill material in an underfill cavity having a plurality of solder bumps. The method includes the operations of: determining a mesh having a plurality of elements according to the underfill cavity; obtaining a reference force according to the underfill cavity; obtaining a driving force and a flow speed of the underfill material according to a plurality of weighting factors and the reference force, wherein the plurality of weighting factors respectively correspond to the plurality of elements; obtaining a plurality of volume fractions respectively corresponding to the plurality of elements according to the flow speed; and measuring the underfill profile according to the plurality of volume fractions.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A method of measuring an underfill profile of an underfill material in an underfill cavity having a plurality of solder bumps, comprising:

determining, by a processor, a mesh having a plurality of elements according to the underfill cavity, wherein the mesh is configured to define a simulation domain of the underfill cavity;

obtaining a reference force in the underfill cavity according to a pressure in the underfill cavity and a capillary pressure model;

obtaining a driving force provided on the underfill material so as to obtain a flow speed of the underfill material according to a plurality of weighting factors and the reference force, wherein the plurality of weighting factors respectively correspond to the plurality of elements;

obtaining, according to the flow speed of the underfill material, a plurality of volume fractions based on a transport equation, wherein the plurality of volume fractions respectively correspond to the plurality of elements;

forecasting the underfill profile according to the plurality of volume fractions, so as to obtain a flowing behavior of the underfill material in the simulation domain of the underfill cavity;

comparing the underfill profile to a predetermined profile; and dispensing the underfill material into the underfill cavity to encapsulate the underfill cavity according to the underfill profile when the underfill profile matches a predetermined profile.

2. The method of claim 1, further comprising:
modifying at least one of the plurality of the weighting factors when the underfill profile deviates from the predetermined profile.

3. The method of claim 1, wherein obtaining the reference force in the underfill cavity according to the pressure in the underfill cavity and the capillary pressure model comprises:
obtaining a substrate contact angle between the underfill material and a substrate of the underfill cavity;
obtaining a chip contact angle between the underfill material and a chip of the underfill cavity;
obtaining a distance between the substrate and the chip;
obtaining a surface tension of the underfill material; and
obtaining the reference force according to the substrate contact angle, the chip contact angle, the distance, and the surface tension.

4. The method of claim 1, wherein the reference force is independent of the plurality of solder bumps.

5. The method of claim 1, wherein obtaining the driving force provided on the underfill material and the flow speed of the underfill material according to the plurality of weighting factors and the reference force comprises:
determining the plurality of weighting factors according to a plurality of bump densities of the plurality of elements.

6. The method of claim 5, wherein the plurality of weighting factors is determined based on a modified Washburn model.

7. The method of claim 5, wherein determining the plurality of weighting factors according to the plurality of bump densities of the plurality of elements comprises:
determining the plurality of bump densities;
obtaining a distance between a substrate of the underfill cavity and a chip of the underfill cavity; and
obtaining the plurality of weighting factors according to the plurality of bump densities and the distance.

8. The method of claim 7, wherein determining the plurality of bump densities comprises:
obtaining a diameter of each of the plurality of solder bumps;
obtaining a nearest distance between two of the adjacent solder bumps; and
obtaining the plurality of bump densities according to the diameter and the nearest distance.

9. The method of claim 7, wherein determining the plurality of weighting factors according to the plurality of bump densities of the plurality of elements further comprises:

obtaining a bump contact angle between the underfill material and the plurality of solder bumps,
wherein the plurality of weighting factors are obtained further according to the bump contact angle.

10. The method of claim 7, wherein the plurality of weighting factors is determined based on Yao's model described in "A New Analysis of the Capillary Driving Pressure for Underfill Flow in Flip-Chip Packaging" published in IEEE TRANSACTIONS ON COMPONENTS, PACKAGING AND MANUFACTURING TECHNOLOGY.

11. The method of claim 5, wherein obtaining the driving force provided on the underfill material and the flow speed of the underfill material according to the plurality of weighting factors and the reference force further comprises:
determining a resistance factor of the plurality of solder bumps according to the plurality of bump densities,
wherein the driving force and the flow speed are obtained further according to the resistance factor of the plurality of solder bumps.

12. The method of claim 5, wherein determining the plurality of weighting factors according to the plurality of bump densities of the plurality of elements comprises:
categorizing the plurality of elements into a plurality of groups,
wherein the elements in the same group have the same weighting factor.

13. The method of claim 1, wherein, according to the driving force, the flow speed is obtained based on a Navier Stokes Equation.

14. The method of claim 1, wherein the transport equation is represented by an expression:

$$\frac{\partial \varphi}{\partial t} + v \nabla \varphi = 0$$

where v is the flow speed, and φ represents the plurality of volume fractions.

15. The method of claim 1, wherein a number of the plurality of elements is less than a number of the plurality of solder bumps.

16. The method of claim 1, further comprising:
obtaining a density of the underfill material, a viscosity of the underfill material, and a shear rate of the underfill material; and
obtaining t pressure in the underfill cavity,
wherein the driving force and the flow speed are obtained further according to the density of the underfill material, the viscosity of the underfill material, the shear rate of the underfill material, and the pressure in the underfill cavity.

17. The method of claim 1, further comprising:
determining a welding angle according to the underfill profile.

18. The method of claim 17, further comprising:
modifying at least one of the plurality of the weighting factors when the welding angle is less than a predetermined angle.

19. The method of claim 18, wherein the predetermined angle is about 135 or 145 degree.

* * * * *